(12) United States Patent
Han

(10) Patent No.: US 11,587,482 B2
(45) Date of Patent: Feb. 21, 2023

(54) FLEXIBLE DISPLAYS WITH CURVED ELECTRODES, DISPLAY DEVICES AND CONTROL METHODS THEREOF

(71) Applicant: BOE TECHNOLOGY GROUP CO., LTD., Beijing (CN)

(72) Inventor: Xinbin Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/622,862

(22) PCT Filed: Apr. 3, 2019

(86) PCT No.: PCT/CN2019/081304
§ 371 (c)(1),
(2) Date: Dec. 13, 2019

(87) PCT Pub. No.: WO2020/113876
PCT Pub. Date: Jun. 11, 2020

(65) Prior Publication Data
US 2021/0335172 A1 Oct. 28, 2021

(30) Foreign Application Priority Data
Dec. 6, 2018 (CN) .......................... 201811487614.1

(51) Int. Cl.
*G06V 40/13* (2022.01)
*G09G 3/00* (2006.01)
(Continued)

(52) U.S. Cl.
CPC ......... *G09G 3/035* (2020.08); *G06V 40/1318* (2022.01); *G09G 3/3225* (2013.01);
(Continued)

(58) Field of Classification Search
CPC .. G06F 1/1652; G02F 1/133305; G09F 9/301; H01L 51/0097; H04M 1/0268
See application file for complete search history.

(56) References Cited

U.S. PATENT DOCUMENTS

2016/0181346 A1* 6/2016 Kwon ................. H01L 27/3262
257/40
2016/0190216 A1* 6/2016 Yang ................. G02F 1/136286
257/91
(Continued)

FOREIGN PATENT DOCUMENTS

CN 102087824 A 6/2011
CN 104851853 A 8/2015
(Continued)

OTHER PUBLICATIONS

ISA China National Intellectual Property Administration, International Search Report and Written Opinion Issued in Application No. PCT/Cn2019/081304, dated Sep. 18, 2019, 10 pages.
(Continued)

*Primary Examiner* — Yuzhen Shen
(74) *Attorney, Agent, or Firm* — McCoy Russell LLP

(57) ABSTRACT

The present application relates to the field of display technologies, and in particular, to display substrate devices. One of the described display substrates comprises: a flexible substrate; a pinhole array configured to transmit light on the flexible substrate; at least one curved electrode responsive to bending of the flexible substrate around the pinhole array on the flexible substrate; and a plurality of detecting lines; wherein the at least one curved electrode comprises a plurality of curved sub-electrodes connected in series; and at least one of the plurality of curved sub-electrodes is coupled to one of the plurality of detecting lines.

16 Claims, 11 Drawing Sheets

(51) Int. Cl.
*G09G 3/3225* (2016.01)
*H01L 27/32* (2006.01)
*H01L 51/00* (2006.01)
*H01L 27/146* (2006.01)

(52) U.S. Cl.
CPC ...... *H01L 27/3234* (2013.01); *H01L 27/3244* (2013.01); *H01L 51/0097* (2013.01); *G09G 2300/0426* (2013.01); *G09G 2310/08* (2013.01); *H01L 27/14623* (2013.01); *H01L 27/14678* (2013.01); *H01L 2251/5338* (2013.01)

(56) References Cited

U.S. PATENT DOCUMENTS

| | | | |
|---|---|---|---|
| 2018/0068157 A1* | 3/2018 | Zeng | G06K 9/001 |
| 2018/0188861 A1* | 7/2018 | Wu | G06F 3/0443 |
| 2019/0066595 A1* | 2/2019 | Kim | G09G 3/3258 |
| 2019/0393278 A1* | 12/2019 | Wu | H01L 27/323 |
| 2020/0133335 A1* | 4/2020 | Wu | H04M 1/0268 |
| 2021/0349499 A1* | 11/2021 | Wu | H01L 27/322 |

FOREIGN PATENT DOCUMENTS

| | | |
|---|---|---|
| CN | 105222702 A | 1/2016 |
| CN | 105742334 A | 7/2016 |
| CN | 106708300 A | 5/2017 |
| CN | 107223229 A | 9/2017 |
| CN | 107657894 A | 2/2018 |
| CN | 108010948 A | 5/2018 |
| JP | 5460364 B2 | 4/2014 |
| WO | 2017211152 A1 | 12/2017 |

OTHER PUBLICATIONS

State Intellectual Property Office of the People's Republic of China, Office Action and Search Report Issued in Application No. 201811487614.1, dated Mar. 25, 2020, 14 pages. (Submitted with Partial Translation).

* cited by examiner

FLEXIBLE DISPLAYS WITH CURVED ELECTRODES, DISPLAY DEVICES AND CONTROL METHODS THEREOF

CROSS-REFERENCE TO RELATED APPLICATIONS

The present application is a U.S. National Phase of International Patent Application Serial No. PCT/CN2019/081304 entitled "FLEXIBLE DISPLAYS, DISPLAY DEVICES AND CONTROL METHODS THEREOF," filed on Apr. 3, 2019. International Patent Application Serial No. PCT/CN2019/081304 claims priority to Chinese Patent Application No. 201811487614.1 filed on Dec. 6, 2018. The entire contents of the above-identified applications are hereby incorporated by reference for all purposes.

TECHNICAL FIELD

The present application relates to the field of display technologies, flexible displays, display devices, and control methods thereof.

BACKGROUND

At present, flexible display panels have attracted attention due to their deformable and bendable characteristics. Organic light-emitting display (OLED) has attracted attention for self-luminous, wide viewing angle and high luminous efficiency properties. The short response time, high definition and high contrast of OLEDs has made them the first choice for flexible display panels.

SUMMARY

This application describes embodiments of flexible displays, display devices, flexible OLED devices and control methods thereof. Some of these embodiments include integrating a fingerprint recognition function, a bending position detecting function and an angle detecting function within a display device.

A first embodiment of a display substrate, comprises: a flexible substrate; a pinhole array configured to transmit light on the flexible substrate; at least one curved electrode responsive to bending of the flexible substrate around the pinhole array on the flexible substrate; and a plurality of detecting lines; wherein the at least one curved electrode comprises a plurality of curved sub-electrodes connected in series; and at least one of the plurality of curved sub-electrodes is coupled to one of the plurality of detecting lines.

Optionally, the shielding layer is conductive, and in a same layer with the at least one curved electrode.

Optionally, wherein the shielding layer is conductive, and in a same layer with the at least one curved electrode.

Optionally, at least one curved electrode comprises a plurality of curved sub-electrodes, each of the plurality of curved sub-electrodes is coupled to each of the plurality of detecting lines.

Optionally, a contour of at least one of the plurality of curved sub-electrodes and a contour of the at least one curved electrode are substantially the same.

Optionally a contour of the at least one curved electrode is substantially a wave shape.

Optionally, the at least one curved electrode is on at least one side of the pinhole array.

Optionally the plurality of curved sub-electrodes are at edge region of the display substrate.

Optionally, a number of the at least one curved electrode is two, the two curved electrode are opposite to each other.

Optionally, a number of the at least one curved electrode is four, a number of the pinhole array is one, the four curved electrodes surround the pinhole array.

Optionally, material of the shielding layer is resistance strain material.

Optionally, further comprising a fingerprint recognition sensor on a side of the flexible substrate opposite from the shielding layer.

Optionally, the display substrate comprises a display region and a peripheral region surrounding the display region, a projection of the pinhole array on the display substrate is in the display region, a projection of the at least one curved electrode on the display substrate is in the peripheral region.

Optionally, each of the at least one curved electrode has two terminals, one terminal is coupled to a first voltage terminal, the other terminal is coupled to a second voltage terminal; the first voltage terminal is a high voltage terminal, the second voltage terminal is a low voltage terminal.

Optionally, the plurality of detecting lines are coupled to a detecting circuit, the detecting circuit is configured to determine a bending position and/or a bending angle according to voltage values from the plurality of detecting lines.

Optionally, further comprising a plurality of light-emitting elements and a drive circuit; the drive circuit is between the plurality of light-emitting elements and the shielding layer, at least one of the plurality of light-emitting elements is coupled to the drive circuit.

Optionally, the drive circuit comprises a voltage input end, the first voltage terminal and the second voltage terminal are electrically coupled to the voltage input end of the drive circuit.

Optionally, further comprising a first control switch and a second control switch; the first control switch is between the first voltage terminal, the second voltage terminal and each end of each of the at least one curved electrode; the second control switch is between the first voltage terminal, the second voltage terminal and the voltage input end of the driving circuit.

Optionally, further comprising a timing control circuit electrically coupled to the first control switch and the second control switch; during a non-display period, the first control switch is turned on, and the second control switch is turned off; during a display period, the first control switch is turned off, and the second control switch is turned on;

In a second aspect, a control method for a display substrate as described in one of the embodiments above, comprising: during a non-display period, controlling the first voltage terminal and the second voltage terminal to supply a voltage to the two terminals of each of the at least one curved electrode; determining the bending position and the bending angle according to the voltage values examined by the plurality of detecting lines coupled to the detecting circuit, during a display period, controlling the first voltage terminal and the second voltage terminal to stop supplying voltage to the two terminals of each of the at least one curved electrode.

In a third aspect, a display device comprises a display substrate as described in one of the embodiments above.

BRIEF DESCRIPTION OF DRAWINGS

In order to illustrate embodiments of the present application, the drawings used in the description of the embodiments will be briefly described below. It is apparent that the drawings in the following description are only some embodiments covered by the present application.

DETAILED DESCRIPTION

The embodiments of the present application will be described in detail with reference to the accompanying drawings. It is apparent that the described embodiments are exemplary embodiments covered by the application, and not all embodiments within the scope of the application. Many other embodiments covered by the present application will be appreciated by one of ordinary skill in the art.

One embodiment of a flexible OLED display consists of a flexible film or substrate, a thin film transistor (TFT) circuit, a light-emitting device, and a package film which are stacked. A flexible OLED display including a display substrate may have functions such as bending or even folding. One example of a flexible film or substrate is a polyimide (PI) film.

Figure 1:
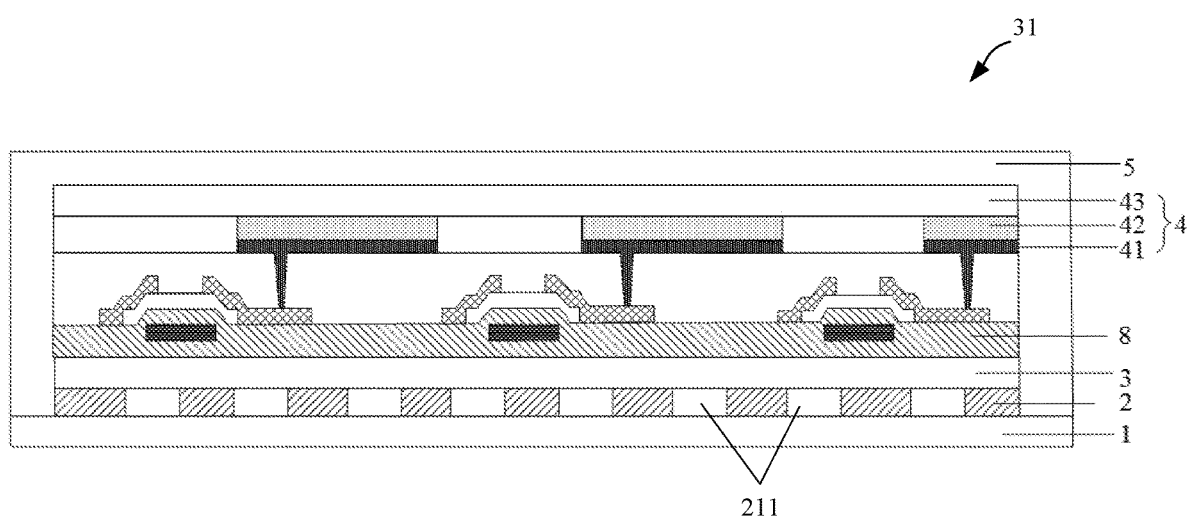
FIG. 1 is a cross-sectional view of a display substrate according to an embodiment of the present application.

An embodiment of a display substrate is depicted in FIG. 1. The display substrate 31 comprises: a flexible substrate 1, a shielding layer 2, an insulating layer 3, a light-emitting array 4, and an encapsulation layer 5. In one embodiment, the flexible substrate 1 forms a base for the display substrate 31 and all layers are stacked above the flexible substrate 1. In other embodiments, layers such as a fingerprint sensor may be positioned below the flexible substrate 1. The layers of the display substrate 31 are generally in face sharing contact as depicted in FIG. 1. However, features of the layers, such as the pinhole array 211 of shielding layer 2, may further define the contact between the layers. Flexible substrate 1 may be composed of a PI film, polyethylenes such as polyethylene terephthalate, or other suitable materials as would be appreciated to one of ordinary skill in the art.

The insulating layer 3 may also perform many functions. The insulating layer 3 may perform traditional functions of providing insulation between layers but also may provide functionality for the fingerprint recognition process. Many different insulating layers may be used. Insulating layers may be transparent, photosensitive and have many other properties. Insulating layers are also often chosen based on curing temperature. Insulating layer 3 may be composed of a polyimide or other suitable material as would be appreciated to one of ordinary skill in the art.

Figure 2:
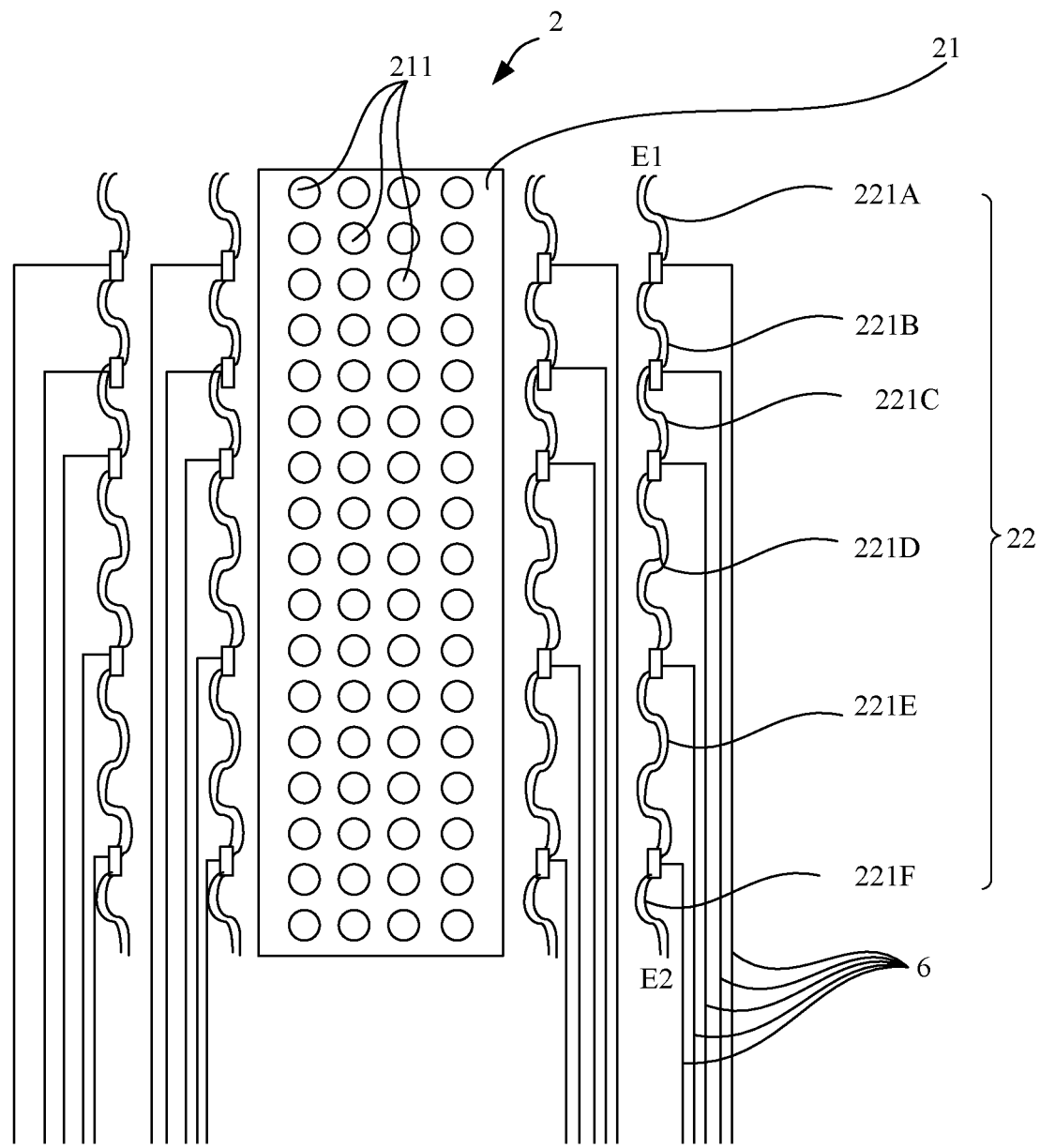
FIG. 2 is a schematic top plan view of a shielding layer in a display substrate according to an embodiment of the present application.
Figure 3:
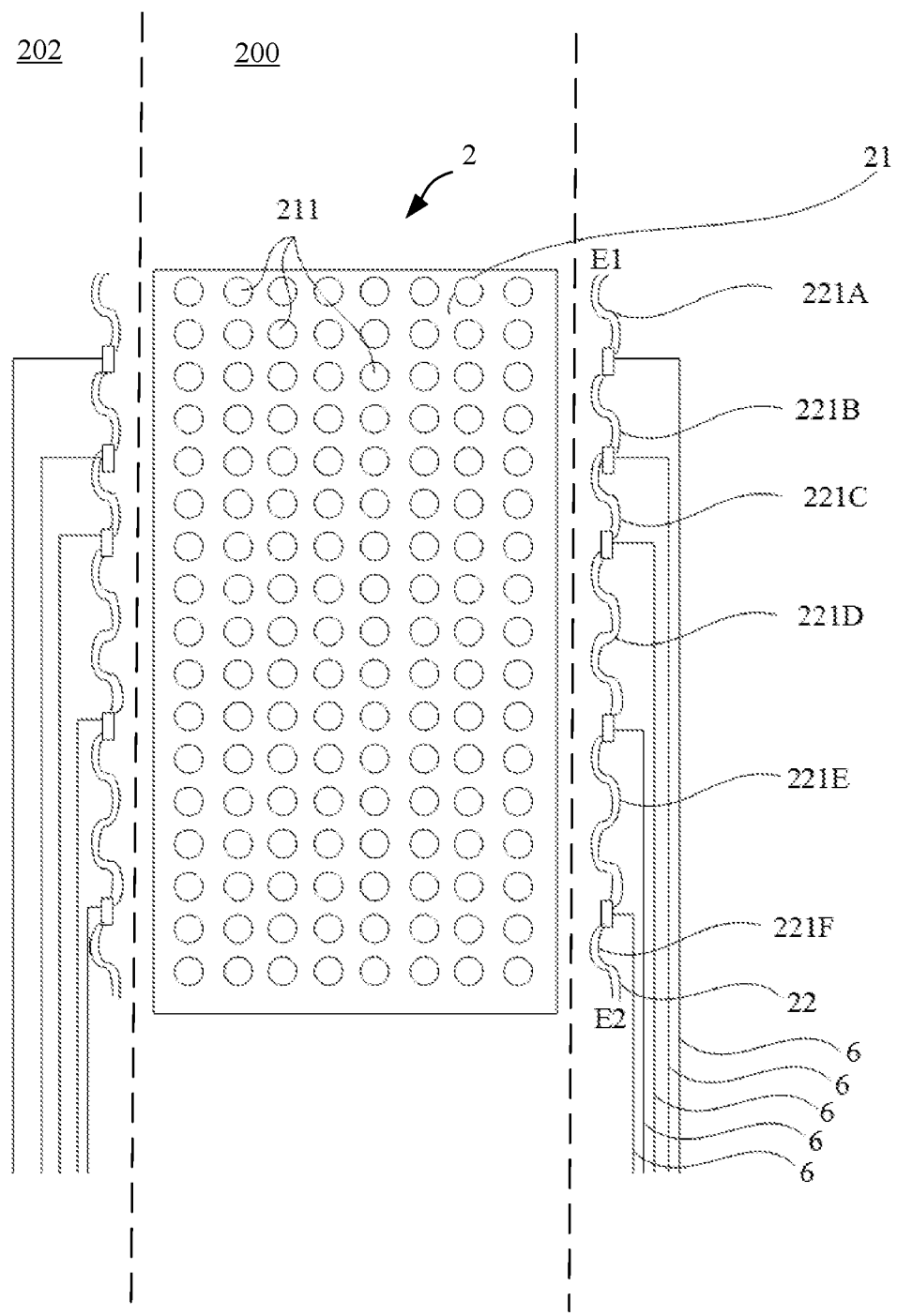
FIG. 3 is a schematic top plan view of a shielding layer in another display substrate according to an embodiment of the present application.

As shown in FIGS. 2 and 3, the shielding layer 2 includes a fingerprint recognition portion 21 and a curved electrode 22, and the material of the shielding layer 2 includes a resistance strain material. The resistance strain material changes properties of electrical resistance with deformation. This change in resistance with deformation may be used to detect changes such as touch, force, bending and angle. Metallic materials are commonly used as resistance strain materials, but other materials may be used as would be appreciated to one of ordinary skill in the art. Further, the resistance strain material may serve multiple purposes within the display substrate. The resistance strain material may carry signal, assist in bending sensing functions, and assist in fingerprint sensing functions. The resistance strain material may be encapsulated within another material of shielding layer 2 or may contact other layers. In one embodiment of the flexible OLED display, the curved electrode 22, fingerprint recognition portion 21 and potentially other structures of shielding layer 2 are comprised of the same strain sensitive material. In these embodiments, the strain sensitive material may also have properties such as photosensitivity or high reflectance to aid in the role of fingerprint recognition.

Embodiments of the fingerprint recognition portion 21 have a pinhole array 211. A display substrate 31 may include at least one curved electrode 22 and each of the curved electrodes 22 may include a plurality of curved sub-electrodes 221 that are sequentially connected in series. As shown in FIG. 2 and FIG. 3, the shielding layer 2 of the display substrate may further include a plurality of detecting lines 6 wherein each of the plurality of bending sensing sub-sections of curved sub-electrodes 221 are connected to at least one of the detection lines 6.

The electrical resistance strain material is a material that can convert a change in mechanical strain into a change in electrical resistance. One embodiment of a flexible OLED display uses resistance strain material in curved electrodes 22. The electrical resistance strain material may include metal or other suitable materials. One of ordinary skill in the art will appreciate that resistance strain material is deformed by a pressing force and specifically a cross section and a length of the resistance strain material are changed. This change in shape causes a corresponding change in a resistance value of the resistance strain material.

Each of the curved sub-electrodes 221 is connected to a detecting line 6. In an embodiment, each of the curved sub-electrodes 221 is respectively connected to one detecting line 6. In another embodiment, the junctions of any two adjacent curved sub-electrodes 221 are respectively connected to a detecting line 6. The embodiment including connecting the junctions comprises one less detection line 6 than curved sub-electrodes 221 in the curved electrodes 22. The embodiment including each curved sub-electrode 221 connected to a detecting line 6 comprises an equal number of curved sub-electrodes 221 and detecting lines 6.

The embodiment shown in FIG. 3 includes a curved electrode 22 including six curved sub-electrodes 221 connected in series. A detecting line 6 and two adjacent curved sub-electrodes 221 are connected at specific points as depicted in FIG. 3. The embodiment of FIG. 3 includes six curved sub-electrodes 221; a first curved sub-electrode 221A, a second curved sub-electrode 221B, a third curved sub-electrode 221C, a fourth bending sub-electrode 221D, a fifth curved sub-electrode 221E, and a sixth curved sub-electrode 221F. The sub-electrodes 221 and detecting lines 6 are present in equal numbers or have a one-to-one relationship. As shown in FIG. 3, a detecting line 6 is connected to a connection point which connects at least one detecting line 6 and sub-electrode 221. FIG. 3 shows an example embodiment including, the first curved sub-electrode 221A and the second curved sub-electrode 221B connected to a detecting line 6. Likewise, the second curved sub-electrode 221B and the third curved sub-electrode 221C are connected to a second detection line 6. The third curved sub-electrode 221C and the fourth curved sub-electrode 221D are connected to a third detecting line 6. The fourth curved sub-electrode 221D and the fifth curved sub-electrode 221E are connected to a fourth detecting line 6. The fifth curved sub-electrode 221E and the sixth curved sub-electrode 221F are connected to a fifth detection line 6.

FIG. 3 also depicts the locations of components within the display substrate. FIG. 3 depicts a top down view of the display substrate. A display region 200 is depicted by hashed lines. A peripheral region 202 is depicted to a side of the display region 200. If viewed from above, a projection of the pinhole array 211 on the display substrate is in the display region 200. Similarly, a projection of the at least one curved electrode 22 on the display substrate is in the peripheral region 202 if viewed from above.

In an embodiment of the present application, each of the curved electrodes 22 may be an integrated structure. In addition, a resistance of the curved sub-electrodes 221 may be equal or not equal to other curved sub-electrodes 221 in each of the curved electrodes 22, which is not limited herein.

As shown in the embodiments depicted in FIG. 2 and FIG. 3, a constant voltage maybe be applied to two ends of the curved electrode 22, depicted as E1 and E2. When a curved sub-electrode 221 is bent, a resistance value of the curved sub-electrode 221 changes, and a voltage value carried by each detecting line 6 connected to the curved electrode 22 changes. Therefore, a bending position can be determined by comparing the voltage carried by each of the detecting lines 6 connected to the curved electrode 22. A bending angle can be determined by quantifying a voltage variation value of the bending position. Comparisons of voltages before and after a bending and voltages between multiple curved electrodes 22 may be made.

In FIG. 3, the curved electrode 22 includes six curved sub-electrodes 221A-F connected in series. Each of the six curved sub-electrodes 221A-F has a resistance which will be indicated as R1-6. Curved sub-electrode 221A has a resistance of R1, curved sub-electrode 221B has a resistance of R2 and so forth. A voltage applied across the curved electrode 22 will be referred to as U. Therefore, the voltage detected by the first detecting line 6 connected to curved sub-electrode 221A is U×R1/(R1+R2+R3+R4+R5+R6) before or after bending. Likewise, the voltage detected by the second detecting line 6 connected to curved sub-electrode 221B is U× R2/(R1+R2+R3+R4+R5+R6). Similarly, the voltage detected by the third detection line 6 is U×R3/(R1+R2+R3+R4+R5+R6); the voltage detected by the fourth detection line 6 is U×R4/(R1+R2+R3+R4+R5+R6); the voltage detected by the fifth detection line 6 is U×R5/(R1+R2+R3+R4+R5+R6). Based on this, if the second curved sub-electrode 221B is bent, the resistance of the second curved sub-electrode 221B changes. If the second curved sub-electrode 221B is most proximate to the bending then the voltage carried by the second detecting line 6 changes greatly. The voltages carried by the first detection line 6, the third detection line 6, the fourth detection line 6, and the fifth detection line 6 but the change is small compared to the voltage carried by second detecting line 6. Therefore, by comparing the voltage detected by each detection line 6 before and after bending, the bending position can be determined. Further, the bending angle can be determined by quantifying the voltage variation value of the bending position for each detecting line.

Flexible OLED display devices are often formed by stacking a plurality of film layers. Each film layer is in face sharing contact with one or more layers above and below the layer. When bending a flexible OLED, a neutral layer refers to a film layer having a minimum force applied to it when the multilayer stacked structure is bent. A position of the neutral layer may depend on application factors such as display thickness. In addition, polarizers, touch screens and even protective covers are included in the stack. The film above the neutral layer is subjected to tensile force. Generally, the farther away from a neutral layer, the greater the tensile force. In a touching event, film layers will be subjected to a pushing force, and the greater the distance from the neutral layer the film is positioned, the greater the pushing force.

In an embodiment of the present application, the shielding layer 2 is disposed close to the flexible substrate which is a relatively large distance from the neutral layer. Therefore, when the flexible OLED display device is bent, the shielding layer 2 is subjected to a large pushing force and the resistance strain material of the shielding layer is deformed. This change in shape causes a change in the resistance value and voltage detected thereby realizing detection of the bending position. The amount of change of the voltage value reflects a magnitude of the force. Accordingly, the larger the amount of change in the resistance value, the larger the amount of voltage change, so that the voltage change value can be quantified to accurately detect the bending angle.

Bending angle can be determined from force because of a flat geometry of a flexible OLED display. A greater force will produce a greater deflection of the flexible OLED display and curved sub-electrodes 221A-F. A large deflection in the flexible OLED display will produce large bending angles and will change the shape and resistance of curved sub-electrodes 221A-F. Therefore, large differences in voltage detected can be correlated with large bending angles.

Figure 4:
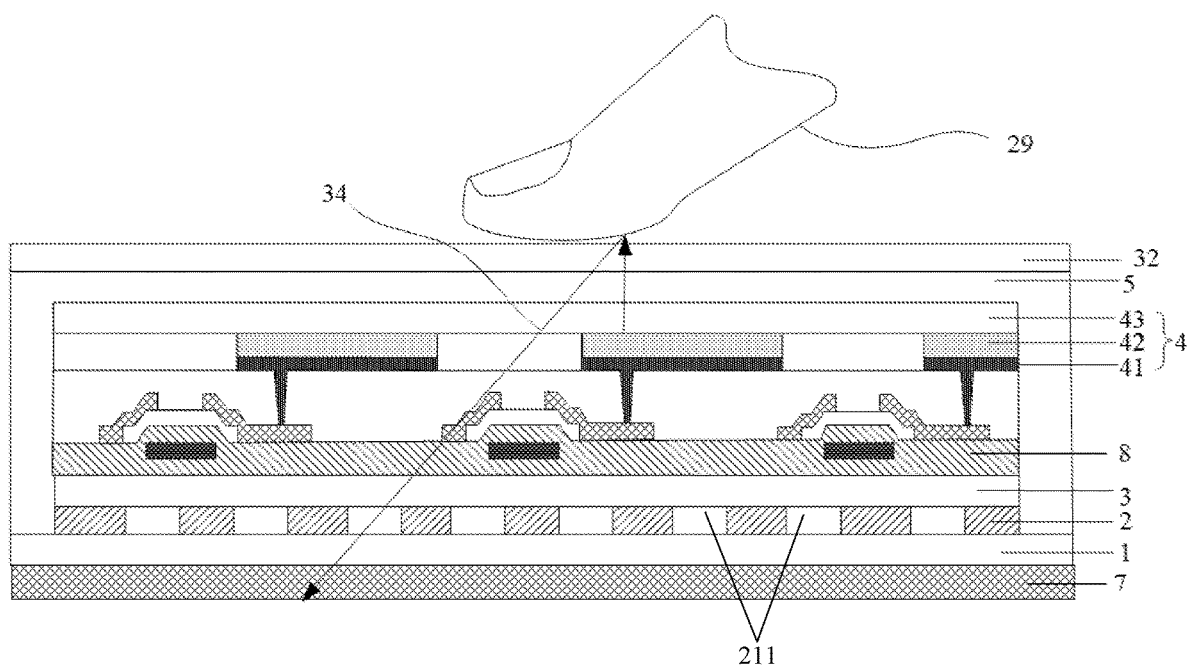
FIG. 4 is a schematic diagram of fingerprint recognition according to an embodiment of the present application.

An embodiment of a flexible OLED display may include the fingerprint recognition portion 21 which comprises the pinhole array 211. A display substrate of a flexible OLED display device may have a self-luminous light-emitting array 4. Light produced by the light-emitting array 4 may be utilized during a display period. As shown in FIG. 4, light 34 emitted from the light emitting array 4 is incident on a finger 29 that is in contact with a cover 32 of the flexible OLED display device. The light 34 is reflected by the finger 29, contacting the cover 32, and passes through the light-receiving pinhole array 211 of the fingerprint recognition portion 21. After passing through the light-receiving pinhole array 211, the light 34 is received by the fingerprint recognition sensor 7. The fingerprint recognition sensor 7 converts the light 34 received into an electrical signal. The electrical signal is then transmitted, processed and compared to stored fingerprints allowing for recognition of a specific fingerprint.

Figure 10:
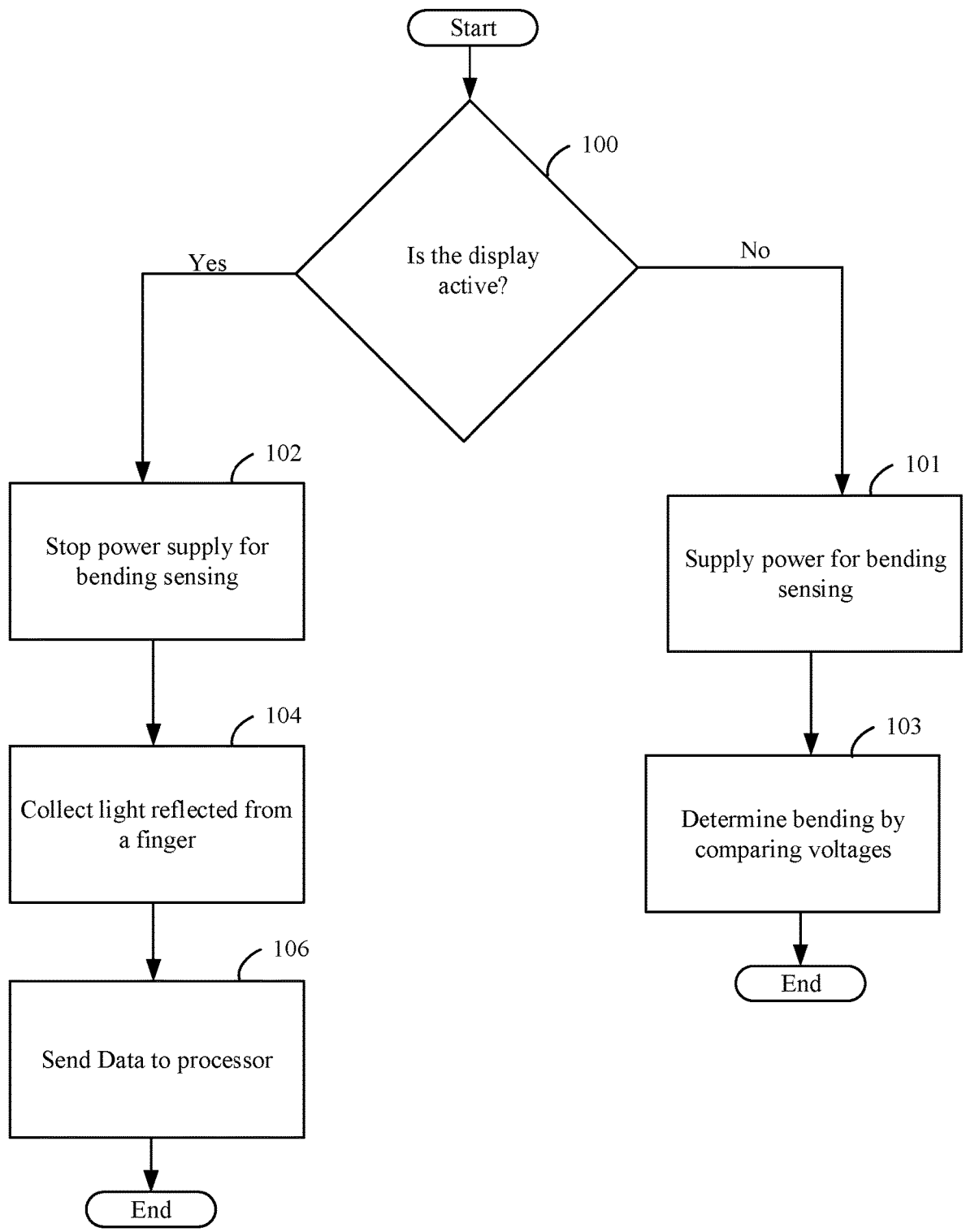
FIG. 10 depicts a method of controlling components of a display.

Fingerprint recognition is also shown in step 104 of FIG. 10. The signal from the fingerprint recognition sensor 7 may be processed by a dedicated circuit or processed using a general processor of the device. In one embodiment, the fingerprint recognition sensor sends data to a device microprocessor which uses a device memory to process fingerprint data and determine if the fingerprint is recognized, as shown in step 106 of FIG. 10. In further embodiments, detection circuit and timing control circuit also send data to the device microprocessor and memory.

A plurality of light-receiving pinholes 211 may form a pinhole array 211 in the shielding layer 2, as shown in FIG. 2 and FIG. 3. The pinhole array 211 may be a part of fingerprint recognition portion 21 which may lie in shielding layer 2. The pinhole array 211 may pass through the shielding layer 2 and allow light reflected from a finger to pass through the pinhole array 211 and the shielding layer 2 to the fingerprint recognition sensor 7. In some embodiments, the pinhole array 211 and a photosensitive sensor may be integrated into a single layer. In other embodiments a photosensitive sensor may be a separate component. The fingerprint recognition sensor 7 may be positioned such that the pinhole array 211 is positioned between the sensor 7 and the finger 29. The fingerprint sensor 7 may be positioned in a layer below the shielding layer 2. In other embodiments, the fingerprint sensor 7 may be incorporated into the shielding layer 2 and the fingerprint recognition portion 21.

The pinhole array 211 may be positioned in various types of arrays depending upon application. The pinhole array 211 may only let a particular portion of light pass through. For example, an image of an object on an opposite side of a small hole may be inverted and a size of the image depends on a distance from the hole. The pinhole array 211 must be positioned to properly capture a fingerprint. Different embodiments of the pinhole array 211 may vary in density and arrangement. Similarly, the arrangement of the pinhole array 211 may depend on a distance between the pinhole array 211 and the fingerprint sensor 7. Arrangements of the pinhole array 211 may also depend on the distance between a surface where a finger is placed and the pinhole array 211. Embodiments of arrangements of the pinhole array 211 may also depend on where the finger will be placed on the device and a portion of a finger to be used for recognition. A radius of the pinholes of pinhole array 211 may also vary depending on factors such as distance from the fingerprint sensor 7, distance from a position of a fingerprint receiving portion, and with a shape of the fingerprint receiving portion.

Figure 9:
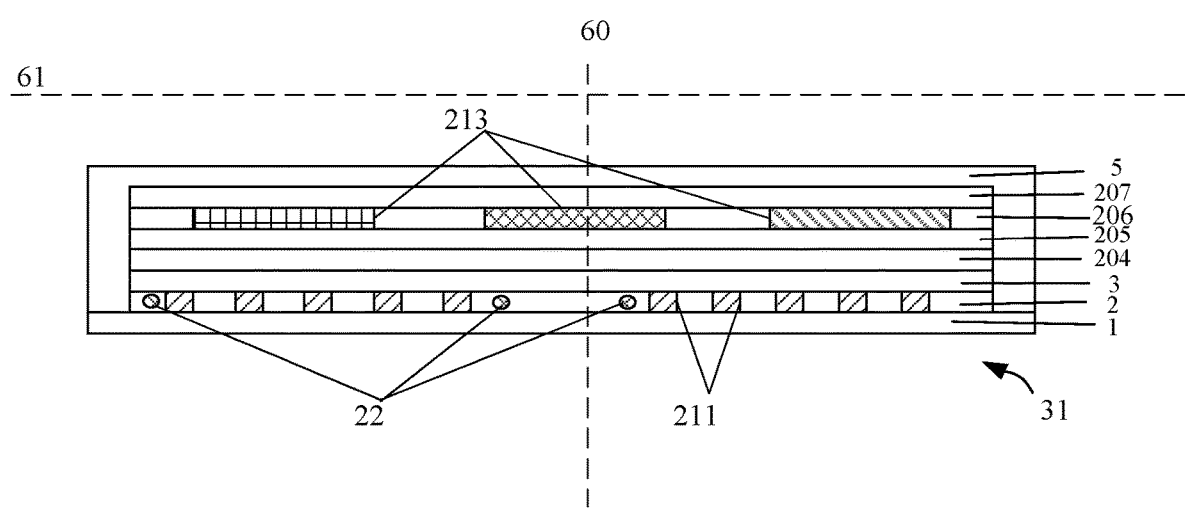
FIG. 9 depicts a display substrate with a layered structure.

The arrays of pinhole array 211 may be positioned on the fingerprint recognition portions 21 and the fingerprint recognition portions 21 may also be arranged in arrays. In one embodiment, the arrays of pinhole array 211 are substantially the same in each of the fingerprint recognition portions 21 and two or more fingerprint recognition portions 21 are positioned in a horizontal array within the shielding layer 2. "Horizontal" refers to a direction along a plane that layers generally extend parallel to the layers of the display substrate, as shown by the horizontal axis 61; as shown in FIG. 9, a vertical axis 60 is perpendicular to horizontal axis 61.

In other embodiments, the pinhole array 211 on each fingerprint recognition portion 21 may be unique. The array of fingerprint recognition portions 21 may also be varied depending on application. The array of fingerprint recognition portions 21 may vary depending on distance from the fingerprint sensor 7, distance from a position of a fingerprint receiving portion, and with a shape of the fingerprint receiving portion. The arrangement of the fingerprint recognition portions 21 may also vary depending on the signal required by the fingerprint sensor 7.

Embodiments of the shielding layer 2 include the fingerprint recognition portion 21 and the curved electrode 22. The materials of the shielding layer 2 includes a resistance strain material, and a photosensitive layer conductor. Incorporating a fingerprint recognition portion and curved electrodes into the shielding layer integrates touch and bending detection and fingerprint identification into the display itself. This integrated design creates a flexible OLED display that functions to display information, identify fingerprints, detect touch and detect bending. A display with this functionality has many advantages over current display technology. Such a flexible OLED display is highly desirable in many applications such as smartphones.

In an embodiment of the application, the fingerprint recognition portion 21 and the bending sensing unit of curved electrodes 22 are composed of the same material. An embodiment of the shielding layer 2 uses a combined fingerprint recognition sensing layer and bending detection sensing layer. The embodiment with combined functionality uses the characteristics of the photosensitive layer conductor to detect force by measuring changes in resistance due to deformation of the photosensitive layer conductor when it deforms. Therefore, this conductor functions to sense fingerprints, force and bending. Voltage changes caused by deformation are detected and the bending angle is detected by the magnitude of the change in the voltage value. The fingerprint recognition portion 21 and the curved electrode 22 may also be disposed in the same layer, which can reduce the thickness and manufacturing cost of the display substrate. Similarly, the pinhole array 211 and the curved electrodes 22 may be in the same layer, such as shielding layer 2. The curved electrodes 22 may also be in the same layer as the shielding layer 2, as shown in FIG. 9.

In an embodiment of the application, as shown in FIGS. 2 and 3, the curved electrode 22 is spiraled along its extending direction. The curved electrode 22 is formed in a shape or contour similar to an elastic member such as a spring. A spiral shape or contour may show advantages for recovery of the deformation of the curved electrode 22. Other shapes or contour such as a sinusoidal pattern may also be used. The shape of a curved electrode 22 may be the shape or contour of the curved sub-electrodes 221 which comprise the curved electrode 22. Many other shapes and contours of the curved electrodes 22 and curved sub-electrodes 221 may also be used such as a wave pattern.

In another embodiment of the present application, as shown in FIG. 2 and FIG. 3, the flexible substrate 1 has a rectangular shape when viewed from a vertical axis 60. In one embodiment, each of the curved sub-electrodes 221 in each of the curved electrodes 22 are arranged in a longitudinal direction of the horizontal plane of the flexible substrate 1. These curved sub-electrodes 221 may be sequentially connected in series. Other arrangements of connecting the curved sub-electrodes 221 are also possible. The bending position and the bending angle of the flexible substrate 1 in the longitudinal direction can be determined using a voltage of the curved sub-electrodes 221. The number of curved sub-electrodes 221 may vary from a single to an array of sub-electrode(s).

The embodiments shown in FIG. 2 and FIG. 3 include at least two curved sub-electrodes 221. The embodiments of FIGS. 2 and 3 arrange the curved sub-electrodes 221 such that each extends in the same direction. The curved sub-electrodes 221 are arranged along an axis perpendicular to the extending direction of the curved electrode 22. The curved sub-electrodes 221 may also be sequentially arranged at intervals.

Embodiments of the display substrate may include at least two adjacent curved electrodes 22 on each side of a fingerprint recognition portion 21. Other embodiments may include at least two adjacent curved electrodes 22 between multiple fingerprint recognition portions 21. Using at least two curved electrodes 22 and detecting voltage values of the plurality of curved sub-electrodes 221 allows for the bending position and the bending angle to be calculated using a comparison of multiple voltage values. A comparison of two values may improve detection and accuracy while preventing erroneous recognition. These values may all be compared by detection circuit 52 to rule out possibilities of erroneous signals.

In an embodiment of the present application, as shown in FIG. 2, the number of the fingerprint recognition portions 21 is one and the number of curved electrodes 22 is four. The curved electrodes 22 are arranged in two pairs on both sides of fingerprint recognition portion 21. Embodiments such as the one depicted in FIG. 2 integrate fingerprint recognition with bending position and angle detection in a single layer of a display substrate.

In still another embodiment of the present application, as shown in FIG. 1, the display substrate further includes a driving circuit 8 disposed between the insulating layer 3 and the light-emitting array 4. The driving circuit 8 is electrically connected to each of the light-emitting elements of the array. The driving circuit 8 is for driving each element of the light-emitting array 4, thereby realizing a display function.

The light-emitting array 4 may be an OLED light-emitting element or a QLED (Quantum dot Light Emitted Diodes) light-emitting element. The light-emitting elements includes an anode 41, a cathode 42, and a light-emitting layer 43.

For example, the light-emitting element may be an OLED light-emitting element, and the light-emitting array 4 may be a top-emitting type light-emitting element or a double-sided light-emitting type light-emitting element. The type of light-emitting element is not specifically limited herein. In a top-emitting type OLED light-emitting element, the light-emitting array 4 and the anode 41 of the OLED light-emitting element is between the flexible substrate 1 and the cathode 42. The anode 41 may be opaque and the cathode 42 may be transparent.

Optionally, as shown in FIG. 4, a display substrate further includes the fingerprint recognition sensor 7 disposed on a side of the flexible substrate 1, away from the shielding layer 2. An orthographic projection of the fingerprint sensor 7 overlaps with an orthographic projection of the fingerprint recognition portion 21 on the flexible substrate 1. In this way, fingerprint projection can be obtained and used for fingerprint recognition.

An orthographic projection is a means of representing a three-dimensional object in two dimensions. An example of using orthographic projections is representing a three dimensional finger as a two-dimensional image for use in fingerprint analysis. For example, in an embodiment of the present application, the light 34 is reflected by the finger 29, contacting the cover 32, and passing through the light-receiving pinhole array 211 of the fingerprint recognition portion 21. After passing through the light-receiving pinhole array 211, the light 34 is received by the fingerprint recognition sensor 7. The light 34 from the finger 29 is used to create an orthographic projection on several components such as the fingerprint sensor 7, the fingerprint recognition portion 21 and the flexible substrate 1. These projections may have many relations to each other based on the arrangement of the components. For example, projections of the fingerprint sensor 7 and the fingerprint recognition portion 21 may completely overlap. These projections may also be offset. If there are multiple fingerprint recognition portions 21, then the multiple portions 21 may form an overall projection which overlaps the projection on the fingerprint sensor 7. One of ordinary skill in the art will appreciate that projections of particular components may overlap in a wide variety of ways depending on the spacing and orientation of the components and finger 29.

Figure 5:
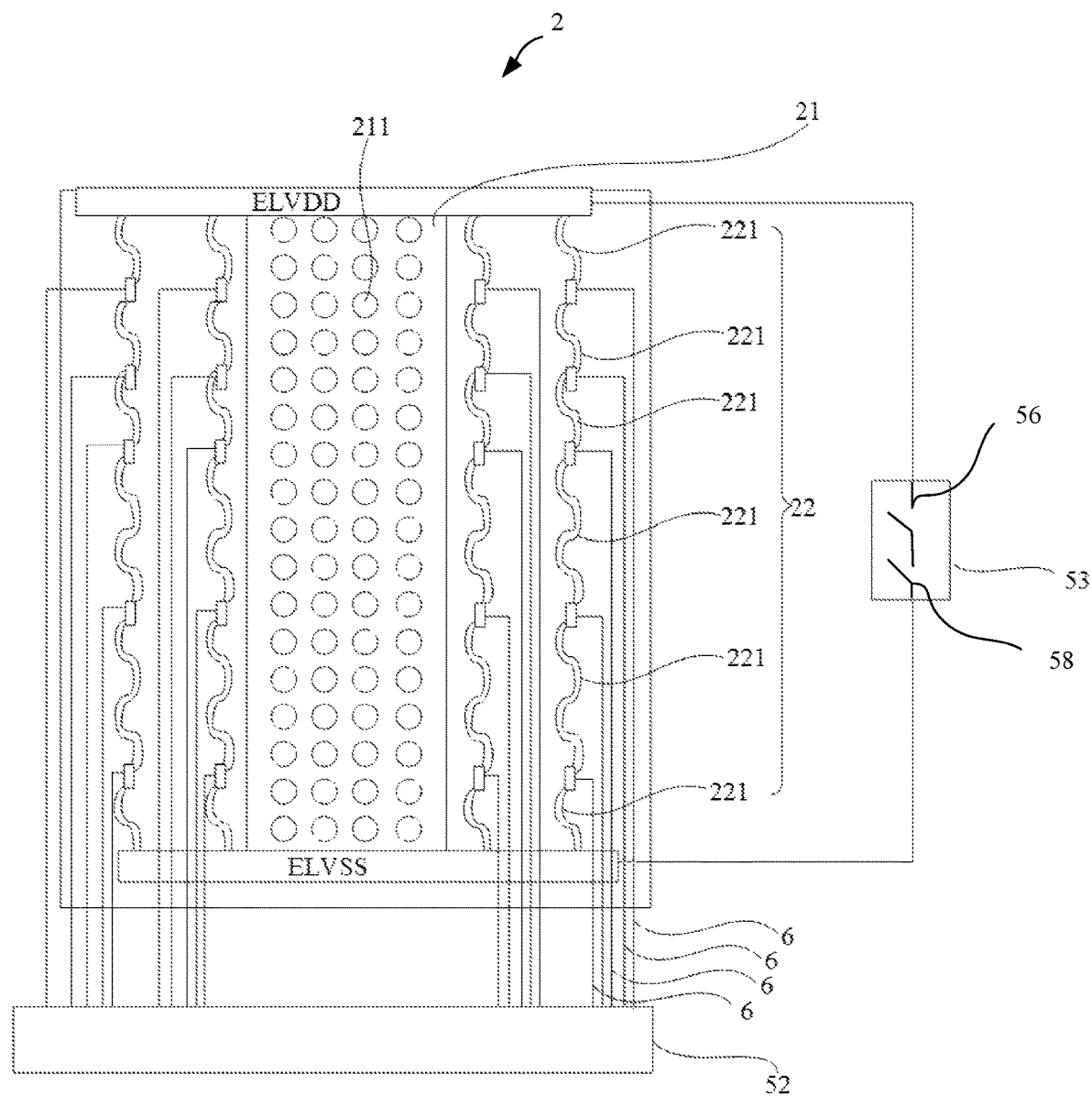
FIG. 5 is a schematic structural diagram of a display device according to an embodiment of the present application.

An embodiment of the present application provides a flexible OLED display device, as shown in FIG. 5, including the display substrate and a detecting circuit 52. One end of each of the curved electrodes 22 are connected to a first voltage terminal ELVDD and the other end is connected to a second voltage terminal ELVSS. The first voltage terminal ELVDD may be a high voltage terminal, and the second voltage terminal ELVSS may be a low voltage terminal. Detection lines 6 are connected to connection points and the detection circuit 52. The connection points connect curved sub-electrodes 221. The detection circuit 52 receives values of the voltage at the connection points by each of the detection lines 6. These voltage values are then used to determine the bending position and the bending angle.

Embodiments of the high voltage terminal and the low voltage terminal are relative to each other. For example, the voltage of the first voltage terminal ELVDD is higher than the voltage of the second voltage terminal ELVSS. In one embodiment, the voltage of the first voltage terminal may be 5 V. and the voltage of the second voltage terminal may be 0 V.

In some embodiments, the detection circuit 52 is integrated in an integrated circuit (IC). The detection circuit 52 may also include a processor or application-specific IC, volatile and/or non-volatile memory.

Figure 6:
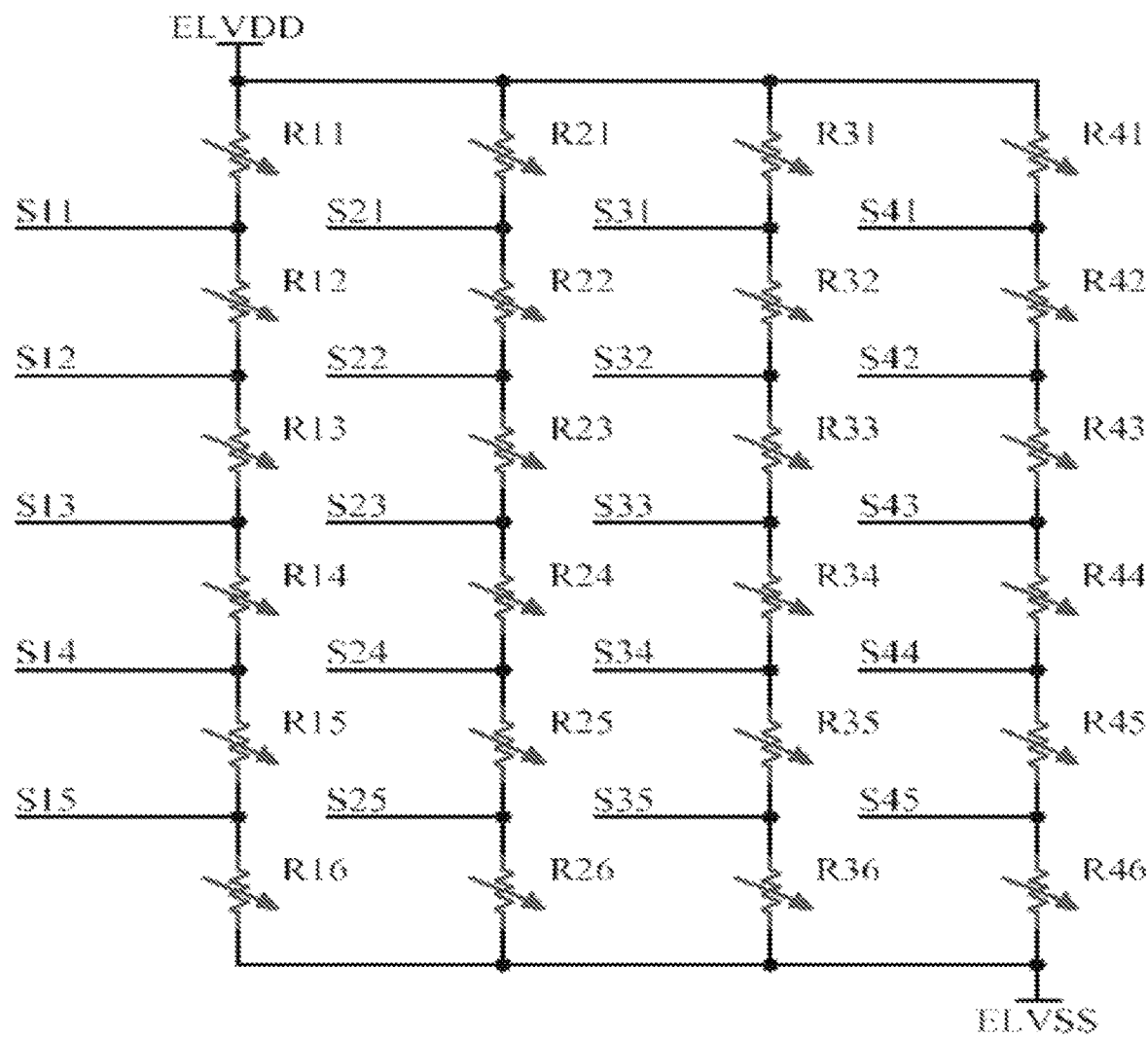
FIG. 6 is an equivalent circuit diagram based on the embodiment depicted in FIG. 5.

An embodiment of an equivalent circuit diagram for detecting the bending position and the bending angle of each of the curved sub-electrodes 221 is shown in FIG. 6. The ELVDD and ELVSS voltages are multiplexed as the voltage across the shielding layer 2. The shielding layer 2 can be compared to a voltage divider circuit. When the shielding layer 2 is bent, the strain sensitive material is bent which causes the resistance value to change. The change of the resistance value causes the voltage value at the detection circuit 52 to change. Detection circuit 52 can detect the bending position by detecting the change of the voltage value. The change in voltage value can be quantified and compared at a time of folding. The bending angle is detected according to the magnitude of change.

Each of the curved sub-electrodes 221 is equivalent to a resistor R, and each of the curved sub-electrodes 221 is represented by Rxy, where x represents a number of columns, and y represents a number of rows. FIG. 6 depicts R11, R12, R13, R14, R15, R16, R21, R22, R23, R24, R25, R26, R31, R32, R33, R34, R35. R36, R41, R42, R43, R44, R45 and R46, respectively. Correspondingly, the connection between each adjacent curved sub-electrodes 221 in the same column is respectively a detection point, represented by Sxy, where x represents the number of columns, and y represents the number of rows. These connections are indicated by S11, S12, S13, S14, S15, S21, S22, S23, S24, S25, S31, S32, S33, S34, S35, S41, S42, S43, S44 and S45, respectively.

Based on this, the voltage is detected by S11, S12, S13, S14, S15, S21, S22, S23, S24, S25, S31, S32, S33, S34, S35, S41, S42, S43, S44 and S45 to enable bending detection. The circuit 52 is based on the voltage detected by each of S11, S12, S13, S14, S15, S21, S22, S23, S24, S25, S31, S32, S33, S34, S35, S41, S42, S43, S44 and S45. Thereby, when the curved sub-electrode 221 changes resistance due to bending, the bending position and the bending angle can be determined. These determinations are made by quantifying the voltage variation value of the bending position.

In some embodiments of the present application, referring to FIG. 4, the display substrate further includes the driving circuit 8 disposed between the insulating layer 3 and the light-emitting array 4 and electrically connected to each of the light-emitting elements. The first voltage terminal ELVDD and the second voltage terminal ELVSS may also be connected to a voltage input terminal of the drive circuit 8, respectively.

By connecting the first voltage terminal ELVDD and the second voltage terminal ELVSS to the voltage input terminal of the driving circuit 8, it is possible to simultaneously induce the light-emitting array 4 and detect bending as described above.

In still another embodiment of the present application, with continued reference to FIG. 5, a first control switch 56 of timing control circuit 53 is disposed between the first voltage terminal ELVDD, the second voltage terminal ELVSS and the two ends of each of the curved electrodes 22. A second control switch 58 of timing control circuit 53 is disposed between the first voltage terminal ELVDD and the second voltage terminal ELVSS and the voltage input end of the driving circuit 8. The timing control circuit 53 includes a processor or application-specific integrated circuit, volatile and/or non-volatile memory, the first control switch 56 and the second control switch 58. The first and second control switches 56, 58 control the display period of the device. In an embodiment, the first control switch 56 is turned on and the second control switch 58 is turned off during the non-display period of the flexible OLED display device. During the display period, the first control switch 56 is turned off and the second control switch 58 is turned on.

The first voltage terminal ELVDD and the second voltage terminal ELVSS may also be controlled by the timing control circuit 53 to stop supplying power to the voltage input terminal of the driving circuit 8 during the non-display period. The control of the first and second voltage terminal may depend on detected bending. In an embodiment, the ends of curved electrodes 22 are powered, and during the display period, the first and second voltage terminals are controlled to supply power to the voltage input terminal of the driving circuit 8. The first voltage terminal ELVDD and the second voltage terminal ELVSS may also be controlled to stop power supply at both ends of each curved electrode 22 to enable multiplexing of the first voltage terminal ELVDD and the second voltage terminal ELVSS. Controlling the power supply can prevent introduction of additional capacitance and interference between layers such as the TFT layer and the shielding layer during the display period. Allowing additional capacitance or interference may affect the characteristics of the thin film transistor layer, thereby affecting the display presented.

Figure 8:
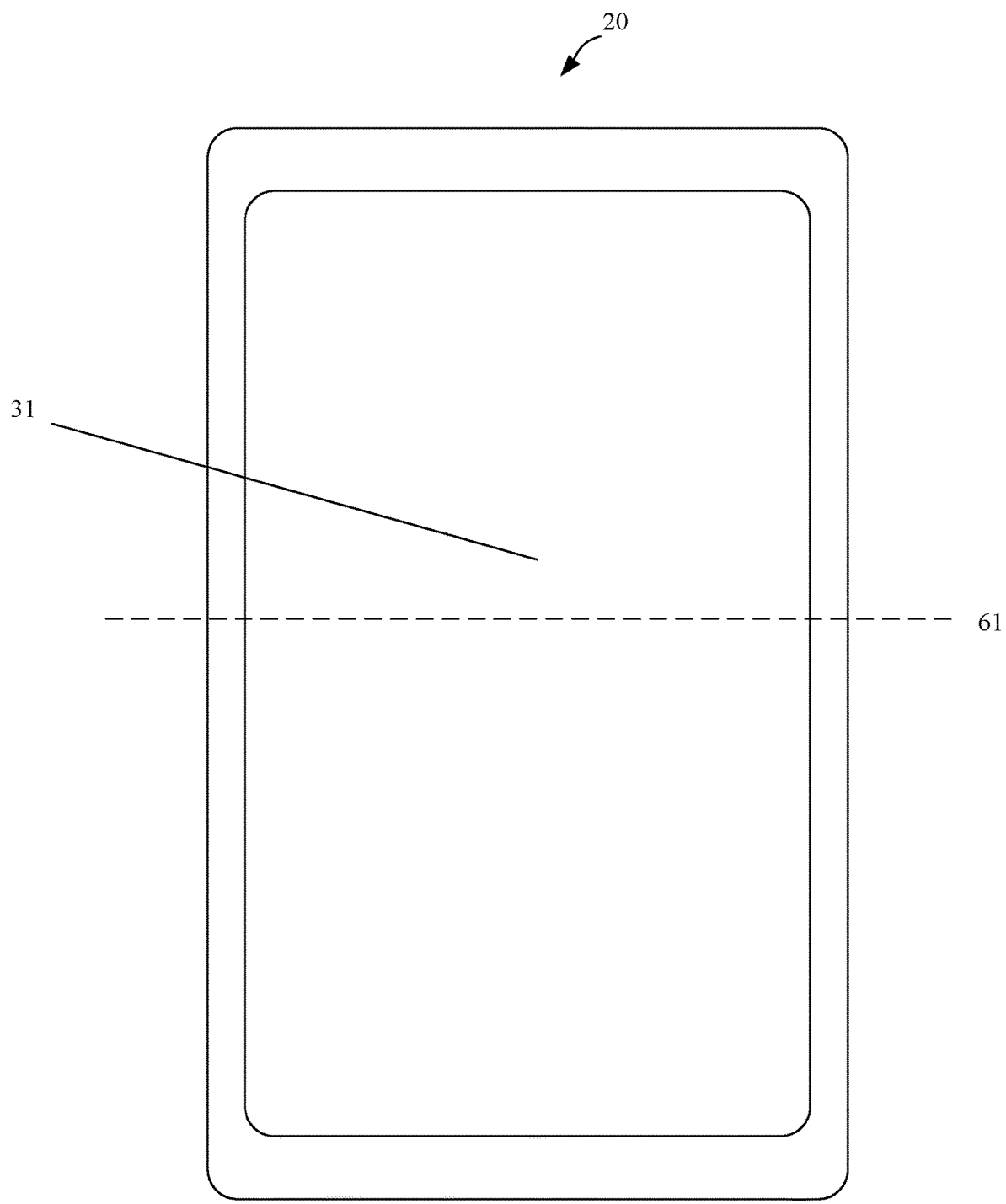
FIG. 8 is a depiction of a device including a display substrate.

The display device provided by the above embodiments may be any product or component having a display function, such as a mobile phone, a tablet computer, a television, a display, a notebook computer, a digital camera, a navigator, and the like. Embodiments of these display devices may be flexible OLED devices but the application is not limited to flexible OLED devices. Other types of devices such as light emitting diode (LED) devices are also envisioned by the application. An embodiment of a mobile phone is depicted in FIG. 8.

In the description of the above embodiments, specific features, structures, materials or characteristics may be combined in any suitable manner in any one or more embodiments or examples.

Figure 7:
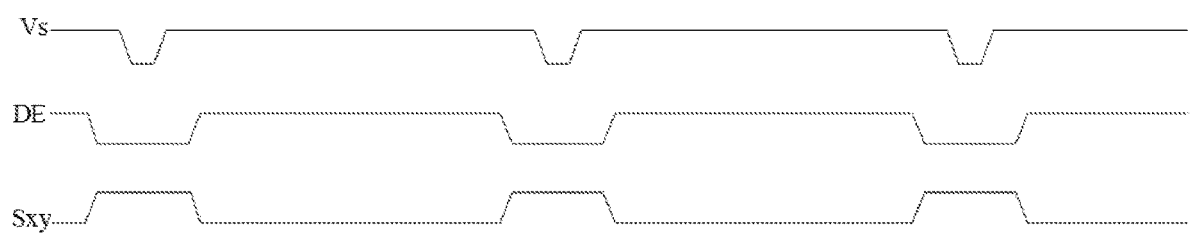
FIG. 7 is a timing control diagram of a bending detection according to an embodiment of the present application.

An embodiment of the present application provides a control method for a flexible OLED display device such as that shown in FIG. 5, FIG. 6, and FIG. 7. The method, depicted in FIG. 10, includes: determining if a display is in a display period or non-display period in step 100. If the display is not active, the timing control circuit 53 supplies voltage to both end points of each of the curved electrodes 22 via the first voltage terminal ELVDD and the second voltage terminal ELVSS in step 101. The supplied voltage allows detecting circuit 52 to determine the bending position and the bending angle according to the voltage value detected by each detecting line 6 in step 103. As described above, the voltage from each detecting line 6 may be compared to determine position, force, bending and angle. Deformation of the curved electrode causes a change in resistance and therefore voltage in detecting lines 6. By comparing these voltages to previous values of a detecting line 6 or to other detecting lines 6, bending information can be determined.

In a display period, the timing control circuit 53 stops the first voltage terminal ELVDD and the second voltage terminal ELVSS from supplying voltage to both ends of each of the curved electrodes 22.

FIG. 7 depicts a timing diagram. FIG. 7 shows is a frame display synchronization signal Vs (VSYNC) and a data signal DE (Data Enable). When the Vs and DE are at high values, image data is enabled and effective image data is displayed. The image data may also be turned off, which is a non-image data display phase. The timing control circuit 53 controls the first voltage terminal ELVDD and the second voltage terminal ELVSS to supply voltages to both ends of each of the curved electrodes 22 in the non-display period, when DE values are low. The voltage on a detecting line 6, signal Sxy, is shown at high levels during the non-display periods. High levels of signal Sxy indicate that power is supplied to the curved electrodes 22 and that detecting circuit 52 is receiving voltage from detecting lines 6.

In an embodiment of the present application, as shown in FIG. 4, the display substrate further includes the driving circuit 8 disposed between the insulating layer 3 and the light-emitting array 4 and electrically connected to each of the light-emitting elements of the light-emitting array 4. The first voltage terminal ELVDD and the second voltage terminal ELVSS are also connected to the voltage input terminal of the driving circuit 8.

In an embodiment of the present application, the control of the on and off states of the first voltage terminal ELVDD, the second voltage terminal ELVSS, the two end points of each of the curved electrodes 22 and the driving circuit 8 are controlled by the timing control circuit 53. The multiplexing of the first voltage terminal ELVDD and the second voltage terminal ELVSS can also be achieved.

FIG. 8 shows a display device 20 including display substrate 31. The display substrate 31 includes components described in reference to other figures such as the shielding layer 2, the flexible substrate 1, and the insulating layer 3. The vertical axis 60 (not shown at FIG. 8) may extend out of the display substrate 31 while the horizontal axis 61 extends in a direction of a plane in which the display extends.

FIG. 9 shows a display substrate 31 including a flexible substrate 1 in face sharing contact with the shielding layer 2. The shielding layer 2 is in face sharing contact with the flexible substrate 1 and the insulating layer 3. The insulating layer 3 is in face sharing contact with the shielding layer 2 and TFT layer 204. Many of the layers may be surrounded by a thin film encapsulating layer 30. The layers may be stacked in a vertical direction represented by vertical axis 60. The layers may extend along a horizontal plane represented by horizontal axis 61. Further, the stack includes anode 205, light-emitting element layer 206 and cathode 207. FIG. 9 depicts how layers of an OLED are stacked.

FIG. 10 depicts control of an embodiment of a flexible OLED display with a fingerprint sensor and bending sensor incorporated therein. In step 100, it is determined if the display is active. If the display is determined to be active, then the timing control circuit 53 may stop power to the at least one curved electrode 22 in step 102. When the display is active, light from the display may be reflected off of a finger and used in a fingerprint recognition step 104. In step 106, received light may be converted into an electrical signal by the fingerprint recognition sensor 7 and sent to a microprocessor or integrated circuit with memory for a determination of recognition.

If the display is determined not to be active in step 100, then the timing control circuit 53 may supply power to at least one curved electrode 22 in step 101. The detection circuit 52 may determine position, bending, force, angle and other information from voltages of the one or more curved electrodes 22 carried by detecting lines 6 in step 103.

The paragraphs above describe specific embodiments of the present application, but the scope of the present application is not limited thereto. A person skilled in the art would appreciate the technical scope of the present application and not limit the scope to the described embodiments.

Figure 11:
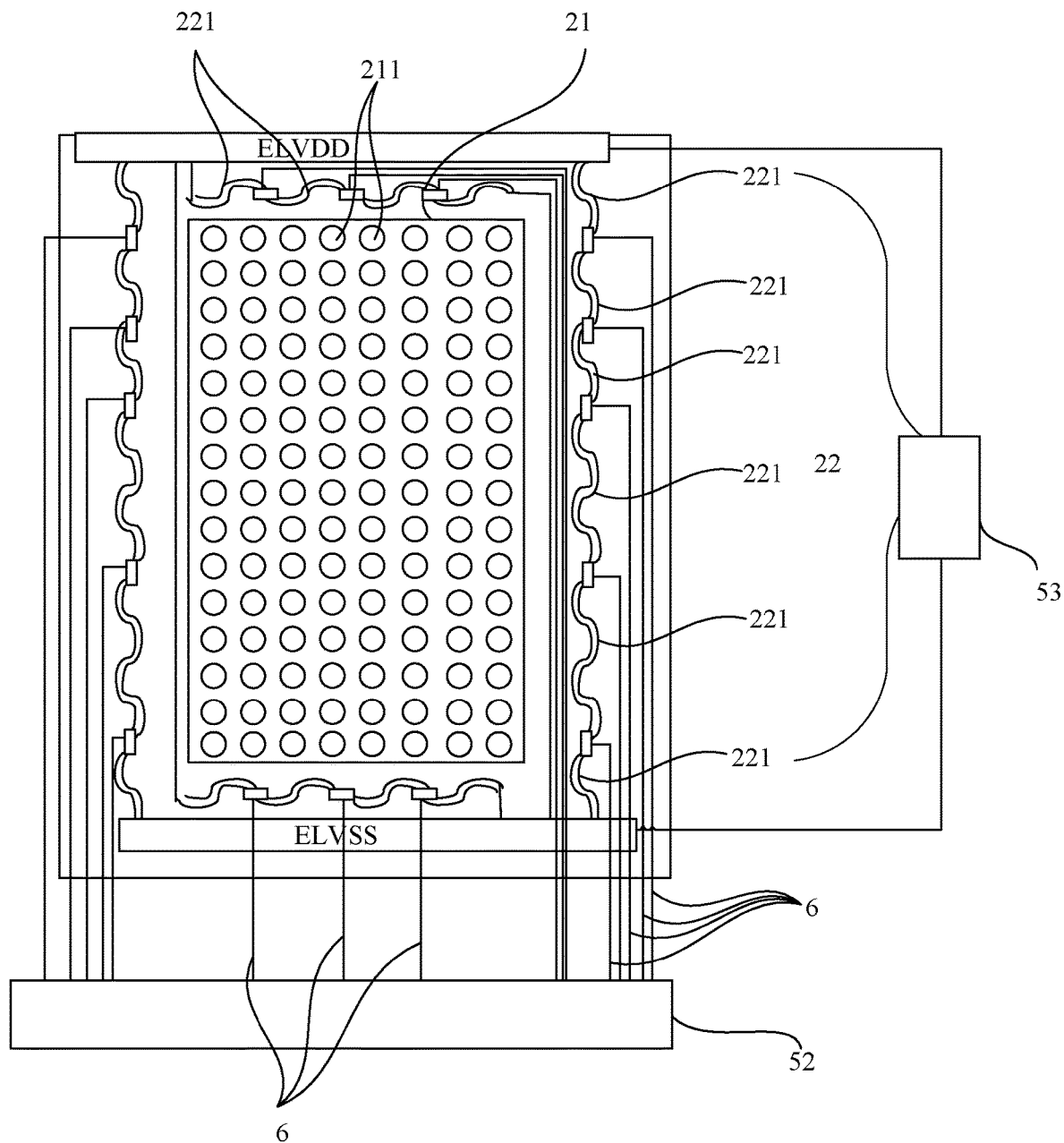
FIG. 11 depicts a schematic structural diagram of a display device according to an embodiment of the present application.

FIG. 11 depicts a flexible OLED display device, including a display substrate and a detecting circuit 52. A first end of curved electrodes 22 are connected to a first voltage terminal ELVDD and the other end is connected to a second voltage terminal ELVSS. The first voltage terminal ELVDD may be a high voltage terminal, and the second voltage terminal ELVSS may be a low voltage terminal. Detection lines 6 are connected to connection points and the detection circuit 52. The connection points connect curved sub-electrodes 221. The detection circuit 52 receives values of the voltage at the connection points by each of the detection lines 6. These voltage values are then used to determine the bending position and the bending angle.

In the description of the present application, it is to be understood that the terms "center", "upper", "lower", "front", "back", "left", "right", "vertical", "horizontal", The orientation or positional relationship of the "top", "bottom", "inside", "outside" and the like is based on the orientation or positional relationship shown in the drawings, and is merely for convenience of description of the present application and a simplified description, rather than indicating or implying the device or component referred to must have a particular orientation, is constructed and operated in a particular orientation, and thus is not to be construed as limiting the application. In the description of the present application, "a plurality" means two or more unless otherwise stated.

The invention claimed is:

1. A display substrate, comprising:
   a flexible substrate forming a base layer of the display substrate;
   a shielding layer formed as a layer of material positioned with a bottom side of the material of the shielding layer in contact with a top side of the flexible substrate and a top side of the material of the shielding layer in contact with a bottom side of an insulating layer, the material of the shielding layer encapsulating the following elements within the shielding layer:
      a pinhole array forming an array of holes extending through the material of the shielding layer from the top side of the shielding layer to the bottom side and transmitting light from the top side of the shielding layer to a fingerprint sensor, wherein the fingerprint sensor is below the flexible substrate;
      at least one curved electrode responsive to bending of the flexible substrate around the pinhole array on the flexible substrate; and
      a plurality of detecting lines;
   a driving circuit and a light emitting array on the top side of the shielding layer;
   wherein light passes through the driving circuit, the light emitting array, and the insulating layer before passing through the shielding layer to the fingerprint sensor;
   wherein the at least one curved electrode comprises a plurality of curved sub-electrodes connected in series; and
   wherein at least one of the plurality of curved sub-electrodes is coupled to one of the plurality of detecting lines.

2. The display substrate according to claim 1, wherein the shielding layer is conductive.

3. The display substrate of claim 1, wherein each of the plurality of curved sub-electrodes is coupled to each of the plurality of detecting lines.

4. The display substrate of claim 1, wherein a contour of at least one of the plurality of curved sub-electrodes and a contour of the at least one curved electrode are substantially the same.

5. The display substrate of claim 1, wherein a contour of the at least one curved electrode forms a repeating curvature in a direction of the extension of the at least one curved electrode.

6. The display substrate of claim 1, wherein the at least one curved electrode is positioned in a peripheral region lateral to the pinhole array within a plane of the shielding layer.

7. The display substrate of claim 1, wherein the plurality of curved sub-electrodes is at an edge region of the display substrate.

8. The display substrate of claim 7, wherein a number of the at least one curved electrode is two, and the two curved electrodes are opposite to each other.

9. The display substrate of claim 7, wherein a number of the at least one curved electrode is four, and a number of the pinhole array is one, and wherein the four curved electrodes surround the pinhole array.

10. The display substrate of claim 1, wherein a material of the shielding layer is a resistance strain material and the resistance strain material is encapsulated within another material of shielding layer.

11. The display substrate of claim 1, further comprising a fingerprint recognition sensor on a side of the flexible substrate opposite from the pinhole array and the at least one curved electrode of the shielding layer.

12. The display substrate of claim 1, wherein the display substrate comprises a display region and a peripheral region surrounding the display region, wherein a projection of the pinhole array on the display substrate is in the display region, and wherein a projection of the at least one curved electrode on the display substrate is in the peripheral region.

13. The display substrate of claim 1, wherein the plurality of detecting lines is coupled to a detecting circuit, the detecting circuit configured to determine a bending position and/or a bending angle according to voltage values from the plurality of detecting lines.

14. A control method for a display substrate, comprising:
during a non-display period, controlling a first voltage terminal and a second voltage terminal to supply a voltage to two terminals of each of the at least one curved electrode;
determining a bending position and a bending angle according to voltage values from a plurality of detecting lines coupled to a detecting circuit; and
during a display period, controlling the first voltage terminal and the second voltage terminal to stop supplying voltage to the two terminals of each of at least one curved electrode,
wherein the display substrate comprises:
a flexible substrate; and
a shielding layer positioned such that a bottom side of the shielding layer is in contact with the flexible substrate and a top side is in contact with an insulating layer, the shielding layer comprising the following elements within the shielding layer:
a pinhole array on the flexible substrate configured to transmit light to the flexible substrate, wherein the light passes through the flexible substrate to a fingerprint sensor, wherein the fingerprint sensor is on an opposite side of the flexible substrate from the shielding layer;
the at least one curved electrode, the at least one curved electrode being responsive to bending of the flexible substrate around the pinhole array on the flexible substrate; and
the plurality of detecting lines;
a driving circuit and a light emitting array on the top side of the shielding layer, wherein light passes through the driving circuit, the light emitting array, and the insulating layer before passing through the shielding layer to the fingerprint sensor;
wherein the at least one curved electrode comprises a plurality of curved sub-electrodes connected in series;
wherein at least one of the plurality of curved sub-electrodes is coupled to one of the plurality of detecting lines;
wherein the detecting circuit is configured to determine the bending position and/or the bending angle according to the voltage values from the plurality of detecting lines;
wherein one of the two terminals is coupled to the first voltage terminal and the other of the two terminals is coupled to the second voltage terminal; and
wherein the first voltage terminal is a high voltage terminal and the second voltage terminal is a low voltage terminal.

15. A display device, comprising:
a display substrate comprising:
a flexible substrate; and
a shielding layer positioned such that a bottom side of the shielding layer is in contact with the flexible substrate and a top side is in contact with an insulating layer, the shielding layer comprising the following elements within the shielding layer:
a pinhole array on the flexible substrate configured to transmit light to the flexible substrate, wherein the light passes through the flexible substrate to a fingerprint sensor, wherein the fingerprint sensor is on an opposite side of the flexible substrate from the shielding layer;
at least one curved electrode responsive to bending of the flexible substrate around the pinhole array on the flexible substrate; and
a plurality of detecting lines; and
a driving circuit and a light emitting array on the top side of the shielding layer, wherein light passes through the driving circuit, the light emitting array, and the insulating layer before passing through the shielding layer to the fingerprint sensor;
wherein the at least one curved electrode comprises a plurality of curved sub-electrodes connected in series; and
wherein at least one of the plurality of curved sub-electrodes is coupled to one of the plurality of detecting lines.

16. The display device of claim 15, wherein the pinhole array is formed through a fingerprint recognition portion, and the fingerprint recognition portion and the at least one curved electrode are composed of the same material.

* * * * *